US007038290B1

(12) United States Patent
Li

(10) Patent No.: US 7,038,290 B1
(45) Date of Patent: May 2, 2006

(54) INTEGRATED CIRCUIT DEVICE

(76) Inventor: Chou H. Li, 379 Elm Dr., Roslyn, NY (US) 11576

( * ) Notice: Subject to any disclaimer, the term of this patent is extended or adjusted under 35 U.S.C. 154(b) by 0 days.

(21) Appl. No.: 08/483,938

(22) Filed: Jun. 7, 1995

Related U.S. Application Data

(63) Continuation-in-part of application No. 08/313,350, filed on Sep. 27, 1994, now Pat. No. 6,979,877, which is a continuation-in-part of application No. 07/816,626, filed on Dec. 9, 1991, now abandoned, and a continuation-in-part of application No. 07/809,460, filed on Dec. 9, 1991, now abandoned, which is a continuation-in-part of application No. 07/438,692, filed on Nov. 17, 1989, now Pat. No. 5,082,793, which is a continuation-in-part of application No. 05/838,758, filed on Oct. 3, 1977, now Pat. No. 4,916,513, which is a continuation-in-part of application No. 05/386,102, filed on Aug. 6, 1973, now Pat. No. 4,946,800, which is a continuation-in-part of application No. 05/154,300, filed on Jan. 29, 1986, now abandoned, which is a continuation-in-part of application No. 04/761,646, filed on Dec. 20, 1991, now Pat. No. 3,585,714, which is a continuation-in-part of application No. 04/490,955, filed on Jun. 1, 1965, now Pat. No. 3,430,109.

(51) Int. Cl.
*H01L 29/00* (2006.01)
(52) U.S. Cl. ...................... 257/506; 257/509; 257/515
(58) Field of Classification Search ................ 257/506, 257/509, 515
See application file for complete search history.

(56) References Cited

U.S. PATENT DOCUMENTS

| 2,911,706 | A | * | 11/1959 | Wertwijn | 156/662.1 |
| 2,980,830 | A | * | 4/1961 | Shockley | 156/662.1 |
| 3,098,160 | A | | 7/1963 | Noyce | |
| 3,136,897 | A | * | 6/1964 | Kaufman | 257/506 |
| 3,209,428 | A | | 10/1965 | Barbaro | |
| 3,233,305 | A | | 2/1966 | Dill | |
| 3,283,171 | A | | 11/1966 | Seeds | |

(Continued)

FOREIGN PATENT DOCUMENTS

GB 1086607 10/1967

(Continued)

OTHER PUBLICATIONS

P. J. Stiles et al., "Schottky Barrier Diode", IBM Technical Disclosure Bulletin, vol. 11 No. 1 (Jun. 1968) p. 20.*

(Continued)

*Primary Examiner*—Sara Crane
(74) *Attorney, Agent, or Firm*—Hall, Vande Sande and Pequignot, LLP

(57) ABSTRACT

An integrated circuit device comprising:
 a body of a first solid material having an upper surface and a major bottom surface;
 a pocket of a second solid material having a top surface and a side surface, and a bottom surface which contacts a selected portion of said upper surface on said body;
 said first and second solid materials being so selected as to form, where said pocket contacts said body at said selected portion of said upper surface, an electronic interfacial barrier which is substantially conductive under an applied bias of at least one selected polarity; and
 a solid electrically insulating region which meets said barrier and adjoins both said body and at least a line on said side surface of said pocket;
 wherein at least a part of said solid electrically insulating region comprises nitrogen located at least below the level of said electronic interfacial barrier.

20 Claims, 1 Drawing Sheet

U.S. PATENT DOCUMENTS

| | | | |
|---|---|---|---|
| 3,321,340 A | | 5/1967 | Murphy |
| 3,345,222 A | * | 10/1967 | Nomura et al. ............. 257/586 |
| 3,360,696 A | | 12/1967 | Neilson et al. |
| 3,376,172 A | | 4/1968 | Byczkowski |
| 3,386,865 A | | 6/1968 | Doo |
| 3,411,051 A | | 11/1968 | Kilby |
| 3,426,253 A | | 2/1969 | LaRocque et al. |
| 3,430,109 A | * | 2/1969 | Li ............................. 257/506 |
| 3,440,717 A | | 4/1969 | Hill |
| 3,492,174 A | | 1/1970 | Nakamura et al. |
| 3,500,139 A | * | 3/1970 | Frouin et al. ............... 148/175 |
| 3,515,956 A | * | 6/1970 | Martin et al. ............... 148/1.5 |
| 3,520,139 A | * | 7/1970 | Elkind et al. ................. 60/257 |
| 3,581,161 A | * | 5/1971 | Cunningham et al. ...... 257/737 |
| 3,585,714 A | | 6/1971 | Li |
| 3,586,532 A | * | 6/1971 | MacRae ...................... 437/24 |
| 3,586,542 A | | 6/1971 | MacRae |
| 3,622,382 A | * | 11/1971 | Brack et al. .................. 437/24 |
| 3,648,125 A | | 3/1972 | Peltzer |
| 3,752,711 A | | 8/1973 | Kooi et al. |
| 3,755,001 A | | 8/1973 | Kooi |
| 3,852,104 A | | 12/1974 | Kooi et al. |
| RE28,653 E | | 12/1975 | Murphy |
| 3,970,486 A | | 7/1976 | Kooi |
| 3,982,315 A | | 9/1976 | Kubo |
| 4,101,344 A | | 7/1978 | Kooi et al. |
| 4,139,442 A | * | 2/1979 | Bondur et al. ................ 437/67 |
| 4,916,513 A | * | 4/1990 | Li ............................. 257/506 |
| 5,040,034 A | * | 8/1991 | Murakami et al. .......... 257/471 |
| 5,082,793 A | * | 1/1992 | Li ............................. 257/506 |
| 5,254,218 A | * | 10/1993 | Roberts et al. ............. 156/662 |
| 5,361,326 A | * | 11/1994 | Aparicio, IV et al. ........ 395/21 |

FOREIGN PATENT DOCUMENTS

| | | |
|---|---|---|
| GB | 1214203 | 12/1970 |
| JP | S34-2529 | 4/1959 |
| JP | 42-11772 | 7/1967 |

OTHER PUBLICATIONS

S. S. Brenner, "The Growth of Whiskers by the Reduction of Metal Salts", Acta Metallurgica, vol. 4 (Jan. 1956) pp. 62-74.*

Y. Doo et al., "Making Monolithic Semiconductor Structures for Integrated Circuits Using Composite Insulation and Junction Isolation Techniques", IBM Technical Disclosure Bulletin, vol. 8 No. 4 (Sep. 1965) pp. 659-660.*

Jones, R.E. and Doo, Y., "A Composite Insulator-Junction Isolation," Electrochemical Technology, May-Jun., 1967.

Brenner, S.S., "The Growth of Whiskers by the Reduction of Metal Salts," Acta Metallurgica, vol. 4, Jan. 1956, pp. 62-74.

Stiles, P.J., et al., "Schottky Barrier Diode," IBM Technical Disclosure Bulletin, vol. 11 No. 1, Jun. 1968, p. 20.

Doo, Y., et al., "Making Monolithic Semiconductor Structures for Integrated Circuits Using Composite Insulation and Junction Isolation Techniques," IBM Technical Disclosure Bulletin, vol. 8 No. 4, Sep. 1965, pp. 659-660.

Phillips, A.B., "Transistor Engineering," McGraw-Hill, 1962, pp. 111-115.

Burrill, J.T., et al., "Ion Implantation as a Production Technique," IEEE Transactions on Electron Devices, vol. Ed-14, No. 1, Jan. 1967, pp. 10-17.

Buchanan, B., et al., "High Energy (1 to 2.5 Mev) Ion Implantation For Obtaining Novel Semi-Conductor Junction Structures," Air Force Cambridge Res. Labs., Off. of Aerospace Research, Bedford, MA, pp. 649-684.

Gibbons, J.F., "Ion Implantation in Semiconductors-Part I Range Distribution Theory and Experiments," Proceedings of the IEEE, vol. 56, No. 3, Mar. 1968, pp. 295-318.

NOTES, Solid-State Electronics, Pergamon Press, 1967, vol. 10, pp. 1105-1108, Printed in Great Britain.

Kennedy, D.P., et al., "Calculations of Impurity Atom Diffusion Through a Narrow Diffusion Mask Opening," IBM Journal, Jan. 1966, pp. 6-12.

Appels, J.A., et al., Local Oxidation of Silicon and Its Application in Semiconductor-Device Technology, Philips Res. Repts. 25, 1970, pp. 118-132.

Doo, V.Y., Silicon Nitride, A New Diffusion Mask, IEEE Transactions on Electron Devices, vol. Ed.-13, No. 7, Jul. 1966, pp. 561-563.

McDonald, et al., "Measurement of the Depth Of Diffused Layers In Silicon By The Grooving Method," *Journal of the Electrochemical Society*, vol. 109, No. 2, Feb. 1962, pp. 141-144—see Fig. 2 and p. 143.

"Integrated Circuits Design Principles And Fabrication," McGraw-Hill Book Co. Inc., 1965, pp. 127-131; 145-150; 174-185—Fig. 5-4(a), p. 131); Fig. 5-23, p. 146; Fig. 5-25-5-27, pp. 147-148; Fig. 7-1, p. 175; Fig. 7-2, p. 176; Fig. 7-6(a), p. 179.

"Isolation Method Shrinks Bipolar ICs," *Electronics*, McGraw-Hill, Mar. 1, 1971, pp. 52-55, Fig. 5-6, p. 55.

"Diffusion Depths In Silicon Measured Using Cylindrical Grooves," The American Physical Society Abstracts from the Epitome Of The 1956 Monterey Meeting, Session H, Nov. 1956.

* cited by examiner

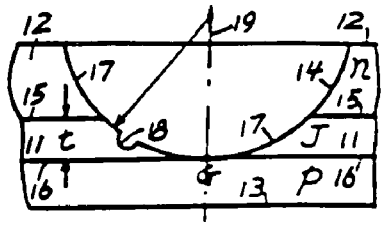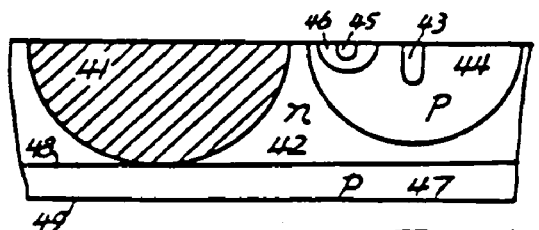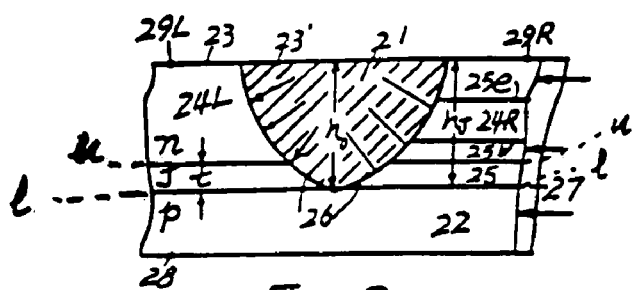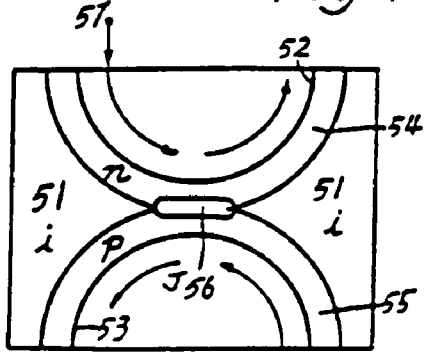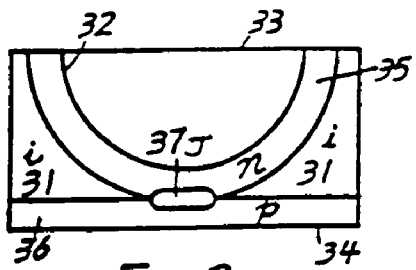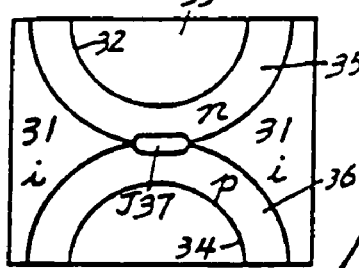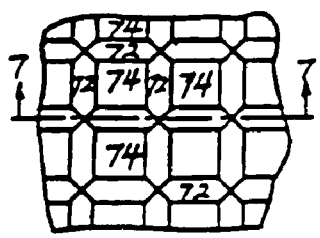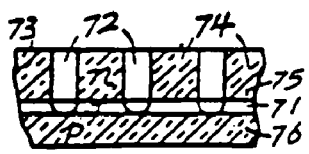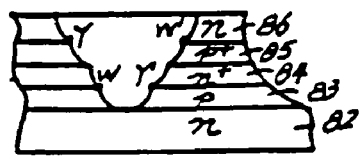

INTEGRATED CIRCUIT DEVICE

CROSS-REFERENCE TO RELATED APPLICATIONS

This is a continuation-in-part (CIP) of parent application Ser. No. 08/313,350 filed Sep. 27, 1994 now U.S. Pat. No. 6,979,877, which in turn is a CIP of applications Ser. No. 07/816,626 filed Dec. 9, 1991 (abandoned) and Ser. No. 07/809,460 filed Dec. 9, 1991 (abandoned), each of the latter two being in turn a CIP of application Ser. No. 07/438,692 filed Nov. 17, 1989 (U.S. Pat. No. 5,082,793), which in turn is a CIP of application Ser. No. 05/838,758 filed Oct. 3, 1977 (U.S. Pat. No. 4,916,513) and a continuation of application Ser. No. 05/386,102 filed Aug. 6, 1973 (U.S. Pat. No. 4,946,800), each of the latter two being a CIP of application Ser. No. 05/154,300 filed Jan. 29, 1986 (abandoned), which in turn is a CIP of application Ser. No. 04/761,646 filed Dec. 20, 1991 (U.S. Pat. No. 3,585,714) which in turn is a CIP of application Ser. No. 04/490,955 filed Jun. 1, 1965 (U.S. Pat. No. 3,430,109). I hereby incorporate each of the above patents and patent applications by reference into this application. Also related are copending application Ser. No. 08/340,793 filed Nov. 15, 1994 as a continuation of said application Ser. No. 07/809,460 (abandoned), application Ser. No. 08/446,423 filed May 22, 1995 (U.S. Pat. No. 5,696,402), and copending application Ser. No. 08/483,937 filed Jun. 7, 1995, each of the latter two being a CIP of said application Ser. No. 08/313,350 filed Sep. 27, 1994.

BACKGROUND OF THE INVENTION

This invention is in the field of improved integrated circuit devices and specifically in the field of miniaturized dielectrically isolated integrated circuit devices.

Solid-state devices in general and semiconductor devices in particular must have exacting surface properties for successful operations. These devices therefore often fail by surface or stress-related mechanical, and subsequently electronic failure mechanisms. The surface of a PN, $P^+N$, $P^-N$, $PN^+$, $PN^-$, PI, NI, metal-oxide, metal-semiconductor, oxide-semiconductor, interfacial rectifying barrier, and heterojunction between different semiconductor materials such as Si on SiC or diamond, or other optoelectromagnetically active signal-translating region (including several coacting, closely spaced rectifying barriers) is especially sensitive to the ambient or contacting materials, contaminants, impurities, or submicron or atomic floating or rubbing dust particles. While not limited thereto, the invention is herein mostly described as preferred embodiments applied to semiconductor devices each having a PN junction as its optoelectromagnetically active region.

The U.S. Pat. No. 3,585,714 describes new methods for simultaneously achieving device isolation, mismatched composite materials shaping and substrate bonding to withstand severe thermal mismatch or chemical reaction induced stresses, junction surface passivation, novel differential expansion of the junction region peripheral surface, physical or optoelectromagnetical exposure of material hidden underneath the junction, high-density integrated circuits with round-bottomed, intersecting and isolating grooves, and/or greatly expanded peripheral surface for optoelectrical communication or for the otherwise difficult or impossible yet large (relative to the narrow junction width or thickness) electrical contacts. Many advantages are thus obtained including: enhanced device reliability particularly during thermomechanical cyclings or in-situ compound formations; increased yield; decreased cost; improved junction region surface passivation; complete device isolation; increased packing density in integrated circuits; increased switching speed; reduced nose, instability, leakage current, and electrical shorts; improved breakdown voltage or other device characteristics; controlled carriers generation, movement, and recombination at or near the junction region peripheral surface; and regulated optoelectromagnetic interaction of the active region with the ambient or contacting material.

The same U.S. patent describes fully the techniques of selective precision material removal by special chemical etching, mechanical polishing with real-time feed-back, or particles bombarding means to achieve differentially expanded junction region peripheral surface of microscopically precise (i.e., better than one micron in accuracy) shape, size, and location. Such a surface is, furthermore, resistant to thermomechanical stress, mobile ions, and even submicron rubbing contaminants and floating dust particles. This resistance minimizes surface failures of the device due to surface microcracks, or submicron or atomic dust particles in the environment.

The Ser. No. 154,300 application is a CIP of the U.S. Pat. No. 3,585,714 patent (on page 1, lines 14–16, or simply 1/14–16), and has a general object to overcome the many difficulties of the U.S. Pat. No. 3,585,714 invention (3/15–17) on device isolation, surface passivation, expanded peripheral surface, increased packing density, and regulated junction interaction with the ambient (2/6–19) by using isolating grooves made by selective material removal by mechanical, chemical, or particles bombarding means (2/20–22). The Ser. No. 154,300 application specifically indicates that "the pn junction devices of FIGS. 1–2 are sufficiently disclosed in my issued patent, U.S. Pat. No. 3,585,714. These are being redescribed (briefly) herein" (4/23–25).

The expanded peripheral surface, being bare, is still not perfectly passivated. Surface layers of inert materials must, therefore, be applied or added onto the differentially expanded, curved peripheral surface for added protection. The same patent also teaches the in-situ formation techniques of the isolating grooves made by thermal oxidation or nitridation.

Unfortunately, these surface layers are far from being perfect or even inert, but are often full of pinholes, microcracks, and other defects. In addition, as pointed out in the U.S. Pat. No. 3,585,714 patent, these layers must, at the same time, be both thick (but non-flaking) for good protection and yet thin (but non-cracking) for reduced mismatch stresses. They must also be permanently, chemically, and continuously yet firmly bonded to the underlying solid-state materials. These surface layers cannot, therefore, always or in all respects, be inert or neutral. These layers may, for example, be chemically active by introducing contaminants, diffusants, unwanted impurities, or chemical reactants. They may also be physically active by creating intolerable mismatch stresses and strains, microcracks, dislocations, or other physical defects in the solid state device. These layers may even be electrically active by providing unwanted dopants, carrier traps, barrier regions, shorting paths, or inductively-coupled and capacitively-coupled surface streaks or films.

SUMMARY OF THE INVENTION

Therefore, to overcome the foregoing and other difficulties, the general object of this invention is to provide an improved, surface-passivated solid state device having very small geometries, with improved device reliability, mechanically, chemically, and electrically;

A second object of the invention is to provide the peripheral surface of PN junction region uniquely buried in and surrounded by discretely spaced-apart, inert material regions and not just thin (typically 3,000–14,000 A), highly stressed and microcracked $SiO_2$ surface layers on the mismatched silicon substrate or pocket.

It is another object of the invention to provide a semiconductor device with an expanded, or differentially expanded, junction region peripheral surface similarly buried in, and surrounded by, metallurgically continuous inert material layers or regions.

Yet another object is to provide a semiconductor device with an enclosing isolation oxide region having a unique, microscopically precise (i.e., accurate to better than 1 micron) geometry, size, position, and chemical composition profiling relative to the PN junction so as to achieve novel effects.

A further object is to form miniaturized high-yield, but low-cost silicon integrated circuits with dielectrically isolated circuit components.

Another object of the invention is to provide dielectrically isolated integrated circuits with in-situ formed, chemically formed or ion-implanted oxide or nitride isolating grooves.

Still another object is to provide methods for low-cost (or cost-competitive), mass-production (by the thousands or millions) of these new miniaturized (feature sizes of less than several microns) solid-state devices.

Various other objects and advantages, and a more complete understanding of the invention, will become apparent to those skilled in the art from the following description and claims, taken in conjunction with the accompanying drawing.

With the above and such other objects in view as may hereinafter more fully appear, the invention consists of novel device structures, materials of composition, and processing methods. However, combinations, modifications, and arrangements of parts and procedural steps are more fully described in the accompanying specification and illustrated in the accompanying drawings. Still, it is to be understood that other changes, variations, combinations, and modifications may be resorted to which fall within the scope of the invention as claimed, without departing from the nature and spirit of the invention.

DESCRIPTION OF THE DRAWING

For the purpose of illustrating the invention, there is shown in the drawing the forms which are particularly preferred. It is understood, however, that this invention is not necessarily limited to the precise arrangements and instrumentalities here shown but, instead, may combine the same described embodiments or their equivalents in various forms.

FIG. 1 is a partial cross-section of a semiconductor device having therein a wrap-around or curved-around, junction region peripheral surface and an isolation groove filed with nitrogen, vacuum, air, solid electrically insulating material, or other ambient;

FIG. 2 shows a portion of a silicon structure having a partly buried, curved PN junction region peripheral surface, which is in contact with a round-bottomed, discretely in-situ formed, solid silicon dioxide (and/or nitride) material region.

FIGS. 3a and 3b show a semiconductor device having its PN junction region peripheral surfaces completely buried in intrinsic, or electronically inert, semiconductor materials;

FIG. 4 shows npn transistor structure in a microcircuit made of discretely in-situ formed, oxide and/or nitride isolation region and three-dimensional dopant diffusion;

FIG. 5 shows a high-power laser device having its buried, PN junction region peripheral surface differentially expanded for improved cooling results.

FIG. 6 is a top view of a monolithic microcircuit containing a system of normally intersecting, gas, nitride, or oxide-filled grooves;

FIG. 7 is a cross-section of the device of FIG. 6, taken along the line 7—7; and FIG. 8 is a cross-section of a "universal integrated circuit" showing the unique circuit structure.

DESCRIPTION OF THE PREFERRED EMBODIMENTS

The PN junction devices of FIGS. 1–2 are sufficiently disclosed in the previously referenced patents and patent applications.

In the devices of FIGS. 1 and 2, the electrical signal current through the interfacial electronic barrier, such as a PN junction, is controlled by mobile carriers in the form of electrons and/or holes. The interfacial electronic barrier generally changes its electrically conductivity depending on the applied bias thereacross. For example, a PN junction is substantially electrically nonconductive under an applied reverse bias, but conductive under applied forward bias. That is, the PN junction is substantially either nonconductive or conductive under an applied bias of at least one selected polarity. This PN junction is a critical component in many, but not all, of the solid-state devices of the invention.

Other than PN junctions, metal-semiconductor or Schottky barriers, heterojunctions (e.g., between Si, SiC, or GaAs, and diamond), metal-oxide, and other electrically rectifying or non-rectifying barriers can also use this invention for, for example, surface cooling, optical communication, or minimization of stress-induced mechanical damages to prevent electronic failures of the device.

While the illustrated embodiments given in this specification employ certain forms of device design and processing procedures, other embodiments may employ other device designs to be achieved with other processing procedures. Still other alternatives in the device designs and procedures are possible. Some techniques are provided for the alternative approaches toward filling the objects of the invention.

In a first form of the invention, the device of FIG. 1 has a single-crystalline, device substrate comprising a PN junction (transition, or depletion) region 11 of appreciable thickness, t, formed between a p-type, silicon substrate 13 and an n-type doped, epitaxial silicon layer 12 grown thereon. That the junction region 11 has finite thickness is shown by, e.g., Transistor Engineering by A. B. Phillips, McGraw Hill Co., N.Y., 1962, pp. 111 and 115. A cylindrical groove 14 of radius r has a rounded bottom terminating at the bottom point G, and is formed generally into and past the junction region 11, defined by its upper and lower end or boundary planes, 15—15 and 16—16, respectively. The layer 12 has a top surface, a side surface, and a bottom surface spaced from the top surface in the vertical direction. The bottom p-type substrate has a top surface which adjoins the bottom surface of the layer. The groove has a peripheral surface which adjoins a side surface 3 of the layer 24, and extends away therefrom in a second direction transverse to the first direction, i.e., horizontally. The groove may be an air groove, as in FIG. 1; or may be completely or partly filled at the bottom with a third solid material 21 to above the PN junction, as shown in FIG. 2.

The peripheral surface 17 of the junction region 11 is distinctly curved and curved-around. The curvature is readily visible to the naked eye on the microphotos, and is intentionally designed and produced. This is unlike the infinitesimal, unintentional curvature at the central flat portions of the diffused oxide groove on the devices before the mid-1960's. The surface has two opposing sides each containing more than one distinct slopes across the thickness direction. When the groove has a curved or round bottom. The groove bottom has a symmetrical shape with respect to the bisecting longitudinal plane 19 such as is shown in FIG. 1. Also, the peripheral surface expansion is infinite at the lowest point G, but decreases monotonically and equally on both sides thereof, toward the transversely-expanding, higher level positions.

For a PN junction region of a given thickness (e.g., t=1 micron), maximum local or integrated PN junction peripheral surface expansion obtains when the rounded groove bottom G substantially coincides with lower end plane (16—16 in FIG. 1 or 1—1 in FIG. 2). Specifically, in this case, the local surface expansion is or approaches infinity. Further, the rounded groove bottom G is exactly 1 micron below the upper end plane (15—15 in FIG. 1 and u—u in FIG. 2) of the 1-micron junction region. That is, when the groove bottom G is in the lower end plane 16—16 of the junction region, the rounded groove bottom G is 1 micron below at least a selected part of the PN junction, i.e., the upper end plane or line (in the cross-sectional view) or the intersection line or point (in the cross-sectional view) of the upper end plane with the groove surface (e.g., 14 in FIG. 1).

In addition, the groove 14 in FIG. 1 also contains a smaller groove or subgroove 18 therein on its left side. This subgroove is traceable to FIG. 1 of the Ser. No. 154,300 and even Ser. No. 761,646 applications. In the Ser. No. 761,646 application (now U.S. Pat. No. 3,585,714), the subgroove K' is located on the lower junction plane 1—1. In all subsequent applications, the subgroove 18 is slightly above the lower end plane 16—16 but totally inside the 1 -micron PN junction region. In all cases, the semicylindrical subgroove K' or 18 has a radius of curvature of less than ½ the PN junction thickness, i.e., less than ½ microns. The radius of curvature of the subgroove is, therefore, 1–4 orders of magnitude smaller if the main groove 17 has a radius of curvature r of 0.001, 0.01, 0.1, or 1.0 cm (See row 1 of Table 3 given below). The change of the radii of curvature is rapid, within 1 micron along the subgroove. Further, the subgroove K' or 18 is contained within a vertical distance of less than the width of junction region, i.e., 1 micron. Also, two points on the subgroove are within one micron from each other and from an intersection of the PN junction with the groove bottom. The centers of curvature of both the main groove 17 and subgroove 18 are on the same side, i.e., on the right side, of the groove and subgroove (FIG. 1). Both the groove and subgroove may be filled with air, or solid material as in groove 21 of FIG. 2.

The junction region 11 of the device of FIG. 1 can be prepared first before the isolating groove 14 is formed into the doped, n-type epitaxial layer 12. A feature of the invention, however, is to form the oxide region 21 first at a high temperature (typically 1000 to 1350° C.) followed by the junction formation. The subsequent, lower-temperature junction-forming step, by, for example, dopant diffusion at 900° C. or ion implantation at even lower temperatures, relieves excessive compressive residual stresses. But some residual, beneficial compressive stresses always remain because of the temperature differences in oxidation and junction formation.

The U.S. Pat. No. 3,430,109 and U.S. Pat. No. 3,585,714 patents disclose grooves of various shapes, including cylindrical, ellipsoidal, paraboloidal, conical or V-shaped (e.g., U.S. Pat. No. 3,585,714:3/57–58, 9/16–17, and 9/6), deep but narrow slots or cylindrical drilled holes with either flat groove bottoms (e.g., Ser. No. 154,300:FIG. 4) or or cylindrically rounded groove bottoms (e.g., U.S. Pat. No. 3,585, 714:9/61–63 and FIGS. 5–6). In both cases, the aspect ratio or length or depth/width ratio of the holes or slots is over 3 or 5.

The use of these holes or slots are threefold in the U.S. Pat. No. 3,585,714 patent: 1) to provide three-dimensional diffusion or ion-implanted sources (U.S. Pat. No. 3,585,714: 9/15–28), 2) to lower the mismatch stress during wafer bonding; and 3) to remove at T in FIGS. 5–6 a dislocation, a microprecipitate, a zone of resistivity variation, or other defect (U.S. Pat. No. 3,585,714:9/70–72). Such point or line defective areas may electrically short or leak, and are not the desired semiconductor Si or Ge material, as seen below.

Li has studied the formation of line or point defects during growth of the Si or Ge crystal. For his review paper on "Epitaxial Growth of Silicon and Germanium" in Physica Status Solidi, Vol. 15, 1966, pp. 3–56 and 419–450 (page 51 included), Li derived normal freezing equations for phase diagrams with realistic, curved liquidus and solidus lines. His equations thus allow the computation of the step-by-step or second-by-second impurity (e.g., Sb in Ge) segregation over the entire solidification or crystal growth range, from the initial seeding to the eutectic temperature. The solidification or crystal growth must finish at the eutectic temperature below which no liquid exists. All the eutectic Ge—Sb compound material remaining at the eutectic temperature must then isothermally freeze out to form the point, line or surface defects. While the semiconductor crystal is basically single crystalline, it may still contain subcells or subgrains. Depending on whether the single Ge crystal growth involves subcellular growth or subgrain growth and on the wettability of the eutectic melt on the Ge crystal, the thus-formed eutectic defective areas may be lines (or dislocations) among three neighboring subcells or points (or microprecipitates) among neighboring subgrains. With initial Sb concentration, $c_o$ of $10^{-6}$ (1 ppm), $10^{-5}$ (10 ppm), or $10^{-3}$ (100 ppm), the size (in microns) of the line or point defects for different sizes of subcells or subgrains are given as follows:

TABLE 1

Formation of Line Defects

| | $c_o=$ | | |
|---|---|---|---|
| | 1 | 10 | 100 ppm |
| | Line size/cell size= | | |
| Cell size=: | $5.89 \times 10^{-4}$ | $1.91 \times 10^{-3}$ | 0.0204 |
| 1 cm | 5.69 | 19.1 | 204 |
| 1 mm | 7.51 | 16.5 | 36.3 |
| .1 mm | .006 | 0.19 | 2.04 |

TABLE 2

Formation of Point Defects

| | $c_o=$ | | |
|---|---|---|---|
| | 1 | 10 | 100 ppm |
| | Point size/grain size= | | |
| Grain size=: | $7.51 \times 10^{-3}$ | $1.65 \times 10^{-2}$ | 0.0363 |
| 1 cm | 75.1 | 165 | 363 |
| 1 mm | 0.59 | 1.91 | 20.4 |
| .1 mm | 0.75 | 1.65 | 3.63 |

Hence, for Sb-doped Ge single crystal growth with 1-mm subcell growth, the size of the deep and narrow holes or slots to be drilled or formed in the Ge single crystal wafer should be at least 7.51, 16.5, and 36.3 microns in sizes to completely remove the line defects, respectively for initial Sb concentrations $c_o$ of 1, 10, and 100 ppm. For Sb-doped Ge single crystal growth with 1-mm subgrain growth, the size of deep and narrow holes or slots to be drilled or formed in the Ge single crystal should be at least 7.51, 16.5, and 36.3 microns in sizes to completely remove the point defects, respectively for initial Sb concentrations $c_o$ of 1, 10, and 100 ppm.

The silicon circuit of FIGS. 1 and 2 has a groove with a continuously curved, cylindrical bottom. The bottom has a cylindrical radius of curvature of less than 1 cm. In the upward direction, the groove monotonically increases its width from the bottom. The oxide groove 21 in FIG. 2 has an oxide surface 23' which is substantially coplanar with the first surface 23 of the top material layer 24L, at least adjacent an intersection of the surface 23 and the boundary between the oxide region 21 and material layer 24L.

The groove 14 has a bottom of zero width, achieving the ultimate in miniaturization for a given device feature size. The central flat portions of the groove bottoms, present in prior art devices, unnecessarily occupy precious chip real estate and, in grooves filled with solid matters (FIG. 2) generate harmful stresses and related problems such as microcrack formation and carrier mobility variations, as discussed in my prior patents and application.

Chemical, mechanical, and electrical defects on the device are often very closely related. Mechanical stress from device processing or handling can produce microcracks. These microcracks can cause chemical and electrical shorts or opens, through material breakage or contaminant leakage paths in the microcracks. Chemical reactions, particularly during in-situ oxide formation, induces severe stresses. Operation of the device generates heat, causes thermal mismatch stresses, and enhances diffusion and chemical reactivity. An improper design or processing of the isolating groove can generate excessive stresses leading to electrical device failures.

The grooves have many uses including: (1) a microcircuit structure (FIGS. 6–7); (2) junction surface passivation; (3) very large or nearly infinite surface expansion (U.S. Pat. No. 3,430,109:4/60, U.S. Pat. No. 3,585,714:7/15, Ser. No. 154, 300:5/6–7, U.S. Pat. No. 4,946,800:9/18–21, and Ser. No. 07/809,460:6/18–19); (4) electrical contacting (e.g., at points Y, W, Y', and W' in U.S. Pat. Nos. 3,585,714, 4,946,800:FIG. 7, and Ser. No. 07/809,460:FIG. 8; (5) semiconductor-ambient interaction, carrier injection, surface cooling (e.g., FIG. 5 of Ser. No. 154,300, U.S. Pat. No. 4,946,800 and Ser. No. 07/809,460); (6) new translation of optical and radiation signals at designed minute junction surface at critical locations, spots, or selected points, lines or regions; (7) relief of mismatch stresses and strains (U.S. Pat. No. 3,585,714:10/16–17); and (8) wafer bonding onto highly mismatched substrate (U.S. Pat. No. 3,585,714:10/9–20).

The selection of the proper groove design for each of these applications depends on the object of the grooving. Large surface expansion are useful for electrical contacting, while smaller surface expansion is suitable for device miniaturization. Even with 2-micron groove width (r=1 micron), the surface expansion can still be the greatest possible under the constraint of miniaturization. For example, the groove bottom G is positioned at the lower end plane of the junction region so that the surface expansion is infinite at G, and also high within 0.1 or 1.0 microns of G.

The groove selection also depends on other design parameters. The degree of surface expansion in grooving critically depends on the diameter D of the grooving cylinder and maximum depth h of the grooved surface. As shown in U.S. Pat. No. 3,585,714:6/41–45, even a microscopical shift of merely 0.1 micron groove depth, h, can infinitely change the surface expansion. These parameters D (=2r) and (groove bottom position) h can be changed at will to meet special demands (U.S. Pat. No. 3,585,714:5/50–52).

Specifically, the U.S. Pat. Nos. 3,430,109 and 3,585,714 patents disclose that "dependent on the device design, use, and manufacturing procedures, (and materials of construction such as 'oxide, nitride, glass, organics' ['714:7/48–56], one may put more emphasis on reducing type I or II contaminants or on achieving special effects (such as device miniaturization); and thus select the best surface contour and optimum combination of r and $h_m$. Type I or Type II contaminants refer to oriented accumulation of mobile ions or floating particles or rubbing contaminants, respectively.

For maximum surface expansion, one should use as large a radius of curvature r and make $h_m$ as close to zero as possible, giving maximum protection against type 1 but much less protection against type II contaminants. On the other hand, if type II contamination problem is very serious, or if hundreds, thousands, or millions of closely-spaced circuit elements must be isolated from one another on a single 2-cm wafer in microcircuitry work, r must necessarily be small, thereby providing less protection against type I contaminants." (U.S. Pat. No. 3,430,109:5/52–63, U.S. Pat. No. 3,585,714:8/56–70, and U.S. Pat. No. 4,946,800:3/60–62, and Ser. No. 07/809,460:7/8–10).

Since the present invention deals with close-packed, miniaturized dielectrically isolated solid state device with small groove radius in small chips, r must necessarily be small, down to about 1 micron according to the Table below. That is, the groove width must be less than D=2 r=2 microns (for r=1 micron).

To guide in the groove design, Table 3 is given below. The table, identical to the table in both the U.S. Pat. Nos. 3,430,109 and the 3,585,714 patents, gives the total surface expansions for different combinations of the cylindrical groove radius, r, and the position, $h_m$, of the groove bottom, G. A positive $+h_m$ indicates that the groove bottom, G, is below plane 1—1 (FIG. 1). This is necessary for the groove to combine with the PN junction for dielectrically isolating the circuit components. A negative position, $-h_m$, indicates that the groove bottom, G, is above the 1—1 plane. This is suitable for the thermal, magnetic, or optical communication or contacting. In these later applications, the PN needs only be exposed optically, magnetically, or thermally without actual physical exposure. When $h_m=0$, the groove bottom G is in, or coincides with, the lower end 1—1 plane of the junction region.

The heading in the first column gives the values of different positions, $h_m$. The heading in the first row gives the different grooving radii, r. The smallest radius for miniaturized circuits is $10^{-4}$ cm, or 1 micron, given at the rightmost column 8 in the tables. The wide ranges of $H_m$ and r values are compatible with the very broad scope of the invention and the many products that can be produced with the invention. Since this invention applies to at least several types of unique devices, the whole range of the table is useful and must be used. Each combination of $h_m$ and r gives the best design for a particular application. In particular, miniaturized circuits should use a cylindrical groove surface having a minimum radius of curvature, r, of $10^{-4}$ cm or 1 micron, to thereby give a 2-micron groove width.

that a linearly sloping surface on the device peripheral surface obtained by the usual beveling or tapering method is useful to achieve surface expansion of up to about 5.76 times, corresponding to an equivalent bevel angle of 10°. But the beveled surface extends too much laterally, and hampers device miniaturization. It is also impractical or impossible to obtain more than one beveled surface on a small chip or component, or to completely isolate an active region by multiple bevelings for, e.g., an integrated circuit. Hence, isolating grooves with cylindrical, U-shaped, or V-shaped peripheral surfaces of the present invention are desirable for dielectrically isolated integrated circuits.

The equivalent bevel angle for grooves with different combinations of r and h are given in the following table. It can be seen that this angle is universally 0° for a rounded groove bottom G where h=0. Most of the values of the bevel angle in the table are far below the maximum possible by the

TABLE 3

Surface Expansion for Different r and $h_m$, junction 1um thick

| $h_m =$ | ! | $r = 10^2$ | 10 | 1.0 | 0.1 | 0.01 | $10^{-3}$ | $10^{-4}$ cm |
|---|---|---|---|---|---|---|---|---|
| −0.9 | um! | 448.5 | 141.6 | 44.72 | 14.34 | 4.473 | 1.415 | 0.451 |
| −0.5 | ! | 1.001 | 316.3 | 100.0 | 31.62 | 10.00 | 3.176 | 1.047 |
| −0.1 | ! | 1.343 | 424.3 | 134.2 | 42.43 | 13.43 | 4.275 | 1.471 |
| 0.0 | ! | 1.414 | 447.2 | 141.4 | 44.73 | 14.15 | 4.510 | 1.571 |
| 0.1 | ! | 1.035 | 327.6 | 103.6 | 32.77 | 10.37 | 5.319 | 1.220 |
| 1.0 | ! | 585.9 | 185.2 | 58.58 | 18.53 | 5.880 | 1.925 | . . . |
| 5.0 | ! | 301.9 | 95.45 | 30.19 | 9.558 | 3.061 | 1.121 | . . . |
| 20.0 | ! | 156.2 | 49.39 | 15.63 | 4.965 | 1.649 | . . . | . . . |

Table 3 further shows that for r=1 cm (column 4) and junction thickness t=1 micron, the integrated junction (peripheral) surface expansion can be 103.6, 58.6, and 30.2 times, respectively for $h_m=0.1$, 1.0, 5.0 microns. Hence, the disclosures in Ser. No. 154,300, U.S. Pat. Nos. 4,946,800, 5,082,793, and Ser. No. 07/809,460 (on pages 5, lines 8–11 or 5/8–11, 3/47–56, 3,49–58, and 6/28–7–/4, respectively) for this surface expansion of 30, and 100 times clearly correspond to groove depths of 5.0 and 0.1 microns below the lower junction plane, respectively.

For the peripheral surface expansion to be infinite and to achieve the maximum value, the cylindrical groove bottom point G must coincide with the lower end plane 16, as taught in the U.S. Pat. No. 3,585,714 and 3,430,109 patents. In this case, the equivalent bevel angle theta must therefore be zero, since sin 0°=0 and csc 0° is infinity (U.S. Pat. No. 3,430, 109:3/63–67 and U.S. Pat. No. 3,585,714:5/59–66).

As shown in Table 3 given above and also in the U.S. Pat. Nos. 3,430,109 and 3,585,714 patents, the bottom G of the groove 14 may be within a 5.0, 1.0, or 0.1 microns below the lower end plane 16 of the PN junction region 11. The groove bottom G may lie directly at the lower junction plane 16 (h or $h_m=0$). An elongated (cylindrical) groove 14 may be parallel to the same junction plane 16 and also have its bottom line at G coinciding therewith (h=$h_m$=0), to achieve locally infinite surface expansion even with a small grooving radius r such as 1 micron. The groove 14 may be purposely tilted relative thereto so that the same groove may be above the junction plane 16 at some places (h<0), substantially coincide therewith at another place (h=0), but lie below the same plane at other places (h>0), as disclosed in the U.S. Pat. Nos. 3,430,109 and 3,585,714 patents.

The U.S. Pat. Nos. 3,430,108 and 3,585,714 patents further disclose, at 3/44–4/58 and 5/57–6/61 respectively, conventional beveling method. However, when r=1 or 10 microns, h must be less than 0.1 microns to get small bevel angle for large peripheral surface expansion, if surface expansion is important.

TABLE 4

Equivalent Bevel Angle for Different r and h, junction 1 um thick

| | | r= | | | | |
|---|---|---|---|---|---|---|
| h = um | ! | 1.0 | 0.1 | 0.01 | $10^{-3}$ | $10^{-4}$ cm |
| 0.0 | ! | 0.0 | 0.0 | 0.0 | 0.0 | 0.0° |
| 0.1 | ! | 0.256 | 0.810 | 2.563 | 8.129 | 26.6° |
| 1.0 | ! | 0.810 | 2.56 | 8.129 | 26.6 | — |
| 5.0 | ! | 1.812 | 5.74 | 18.4 | — | — |
| 20.0 | ! | 3.626 | 11.54 | — | — | — |

The purposes of the groove are manyfold. In the order of decreasing importance for miniaturized microcircuits, they include:

1) to achieve the ultimate in device miniaturization by totally eliminating the central flat portions in prior-art devices;

2) to give beneficial proximity effect for the nearby PN junction;

3) to provide stress and strain-relief. The mismatch shear stress at the groove bottom G is zero or nil because of the zero width thereat;

4) to have the inverted arch effect;

5) to provide gaps or mismatch stress isolators in an otherwise impossible oxide layer;

6) to prevent contamination by Type II contaminants. For example, 1-micron dust particles cannot get into a long, 1-micron wide hole; and 7) to provide large area for electrical or optical contacting.

In one preferred embodiment, the isolating groove is formed by a process comprising precisely removing material from a selected area of the surface 23 of material layer 24L in FIG. 2. The grooves in FIGS. 1–2 may be subsequently filled with solid material by diffusion, ion implantation, or vapor deposition. Possible precision material removal processes include:

1) precision mechanical grinding or polishing with real-time feed-back control (at U.S. Pat. No. 3,430,109:FIG. 1 and 2/38–63; U.S. Pat. No. 3,585,714:FIGS. 1 and 3/70–4/51);

2) precision chemical etching using repeated masked chemical etchings immediately after precooling or refrigeration limits localized, preferential deep etching at, e.g., dislocations and subgrain boundaries (U.S. Pat. No. 3,585,714:11/75–12/59);

3) energetic particles bombarding with aligned or focussed ion, electron, laser photons (U.S. Pat. No. 3,585,714:11/24–42). Such energetic particles beams (such as proton) locally and intensely heat up or energize the intercepting surface atoms to the point of evaporation or ejection. Laser beams can be controlled by simple stable optics, while electron beams by electrostatic deflecting means. Further, these energetic beams not only take off material but also supply the necessary thermal or optoelectromagnetic signals to the device whose response thereto may be monitored to measure or regulate the process of the material-removal operation via real-time feedback control. Laser and electron beams have sufficient resolution or accuracy to practice this invention; and 4) combination of the above material removal processes.

These energetic beam processing methods are particularly suitable for forming tiny grooves and holes, slots, or other grooves of less than one or 2-microns width and depth with high precision and aspect (depth/width) ratios of over 3 or 5. See FIG. 7. Microscopically precise chemical etching or mechanical grinding and polishing also can form microscopically precise depression or grooves in silicon or other semiconductor materials. These grooves are microscopically accurate in its shape, depth, chemical composition profiles, and the lateral location.

By 'microscopic' or 'microscopically precise', I refer in this application to dimensions, accuracies, precisions, curvatures, and chemical composition profiles of less than one or two microns.

Properly sized groove systematically varies, in a predetermined manner, the transverse or cross-section area, with the depth or thickness thereof. The precise lateral area of the groove and the adjoining silicon is thus predetermined by the microscopically precise groove. Improved devices having very small geometries for increased packing density in integrated circuits can therefore be made by the above methods. Dielectrically isolated circuits with chemically formed or ion-implanted oxide or nitride isolating grooves can form, for example, the 6 cm×6 cm monolithic microcircuitry wafer of FIGS. 6 and 7 containing thousands or millions of circuit elements.

In a particular embodiment, the device structure of FIG. 2 is made by selectively thermally growing an oxide groove, band, or solid material region 21 of depth $h_o$ transversely into a single-crystalline p-type silicon substrate 22. In FIG. 2, this oxide groove has a planar surface which is coplanar with the top surface 23 of the n-type diffused layer to facilitate metal contacting. This is followed by in-diffusion of n-type dopants from the top surface 23. The diffusion is guided by the peripheral surface of the inert oxide region and is self-aligning. Hence, the masking step is non-critical. Further, the lateral area of the resultant PN junction is microscopically precisely determined by the groove shape, size, and location. The diffusion gives a (top) doped, n-type epitaxial silicon layer 24, and a new PN junction region 25 of thickness t. The PN junction should be above the groove bottom for device isolation.

The oxide groove has a rounded bottom, and a depth, $d_t$, measured from this bottom to the top surface 23'. The groove width increases monotonically from the groove bottom to its top surface. Two groove widths are distinguishable: top width, $w_t$, i.e., the width at the top surface; and 2) intersection width, $w_i$, i.e., the width at the plane of intersection of the groove with the top end plane of the PN junction barrier. Apparently, $d_t$ is not less than $w_i/2$. Also, the radius of curvature of the groove at the intersection plane, $r_i$ is not more than $w_i/2$.

As described in the U.S. Pat. No. 3,585,714 patent and the Ser. No. 154,300 application, in-situ formation of the grooves, without first grooving or silicon material removal, can be also done by: 1) ion or proton implantation and 2) thermal oxidation with oxygen or nitrogen.

Thermal oxidation with oxygen through $Si_3N_4$ masks was well known prior to the U.S. Pat. No. 3,585,714 filing date of Sep. 23, 1968. But the U.S. Pat. No. 3,585,714 patent discloses a "three-dimensional diffusion" method and diffused shape and size control by first forming the microscopically precise groove followed by diffusion through the newly exposed surface formed by the grooving, thereby achieving microscopically precise three-dimensional control as to shape, size, and position of the isolation groove.

The PN junction 25 may be formed prior to or during the oxidation step. The differentially expanded, junction region peripheral surface 26 is surrounded by the inert oxide material region 21. Together with the isolating PN junction 25, this oxide region electrically isolates the two sides of the device. These two sides can, therefore, be used as two independent, electrically isolated but physically integral diodes. Each of the two diodes comprises a top n-type, epitaxial layer 24, a bottom p-type substrate 22 and a PN junction region 25 therebetween. This PN junction 25 thus extends both in the common substrate or buried layer 22 and the top layer 24. These diodes share the same p-type substrate, which electrically connects the silicon pockets 24L and 24R. They are, therefore, physically integral or non-independent; but electrically independently operable diodes as to the biasing voltage applied to, and the signal translation in, the respective PN junctions 25.

For example, while the left 24L/22 diode may be forward biased through suitable contacts 29L and 28, the right 24R/22 diode may be forward biased also (through contacts 29R and 28) but at a completely different voltage, may be zero-biased, or may even be reverse-biased. Two diodes of the integrated circuit of FIGS. 1 and 2 are isolated and independent. This is made possible by the gas-filled or solid-filed groove (14 or 21) at the side thereof and the isolating PN junction (11 or 25) thereunder. Most prior-art devices, such as those of Murphy, are not so dielectrically isolated.

Dopant diffusion or introduction, electrical contacting, and controlled epitaxial layer growth are well known in the semiconductor art. Additional PN junctions 25 band 25e, may be formed in the device of FIG. 2 (See also FIGS. 4 and 8), and the various layers suitable connected to form completely isolated diodes, transistors, tetrodes, . . .

Thermal oxidation of silicon with $Si_3N_4$ masks was well known prior to the U.S. Pat. No. 3,585,714 filing date of Sep.

23, 1968. But the U.S. Pat. No. 3,585,714 patent discloses a "three-dimensional diffusion" method to achieve a new degree of flexibility in dimensional and configuration control. For example, narrow but deep holes, slots, or other grooves may be formed first, and foreign atoms such as oxygen or nitrogen is then introduced by deposition or ion implantation, at selected locations. Internal point, line, surface or massive types of three-dimensional diffusion sources of these foreign atoms then obtain. New groove configurations and shape controls or other results are then possible.

Alternately, narrow but deep holes or slots, or other cylindrical, ellipsoidal, spherical, or conical or V-shaped (U.S. Pat. No. 3,585,714:3/57–58 and 70–71) grooves may first be formed, chemically, mechanically, or with energetic bombarding particles. Oxygen or nitrogen is then introduced through the newly formed groove surfaces using ion-implantation or diffusion, with or without the three-dimensional diffusion or material introduction technique.

The microscopically precisely (accuracy better than 1 or 2 microns) formed empty groove can be filled with thermally formed, vapor-deposited, or other oxide, nitride, glass, organics or other insulating material layer on the newly-exposed (groove) surface. The thermal forming and vapor deposition are done in a controlled manner, rather than by natural and incidental oxidation of a silicon surface newly exposed to the ambient.

To be electrically isolating, the groove 21 need not be completely filled with oxide or nitride. Only a peripheral ring where the groove surface intersects the PN junction requires electrically insulating material. The rest of the groove region can be filled with air or any solid material such as oxide, glass, organics, semiconductor, metal, or intermetallics. Conductive metal, intermetallics, or organics may even serve as contact to the p-type substrate. The metal, intermetallics, semiconductor, oxide or other insulator may be one or more orders of magnitude more electrically conductive than the next material in the above sequence. Because of the accuracy of ion implantation, the oxide peripheral insulating ring, and the metal or intermetallic contact core may both be implanted. Even the inside surface of the groove may be selectively implanted with oxide or nitride. Implantation of other foreign atoms at specified locations to thereby form more complex composite isolating groove. The same composite groove may also be formed by other well-established methods such as chemical vapor deposition.

The groove 14 has a cylindrical, wrap or turn-around bottom of zero width. This groove bottom design achieves the ultimate in miniaturization for any device feature size. This is because the central flat portions of the groove bottoms, present in prior art devices, no longer exist to occupy precious chip real estate. In improperly designed grooves filled with solid matters, excessive, harmfully mismatch stresses and related problems may still exist to adversely affect the carrier mobility control.

The device of FIG. 2 is not a complete device as shown by the curved, cut-out lines on both the left and right sides thereof. A complete device would be similar to the integrated circuit shown in FIGS. 6 and 7 (See also FIGS. 5 and 6 in the U.S. Pat. Nos. 3,430,109 and 3,585,714 patents). In these integrated circuits, the gas, vacuum, or solid dielectrically insulating, close-ended (or annular) grooves provide a plurality of electrically isolated silicon pockets or islands for the electrically independently operable diodes, transistors, or other active or passive components such as resistors, capacitors, and inductances.

Thermally growing $SiO_2$ (silicon dioxide) at elevated temperature by oxygen diffusion downwardly or transversely into selected area of a silicon substrate in the device of FIG. 2 is possible with the usual masking techniques. Diffusion through masked areas is well-developed. Thus, silicon can readily be chemically plated or vacuum deposited with layers of platinum, rhodium, gold, nickel, other metals, or even some nonmetals such as $Si_3N_4$ or SiC. These layers are oxidation-inhibiting for the silicon thereunder, but may be made even more so by other oxidation-preventing surface layers electrolytically plated or otherwise built thereon. Windows may then be opened by mechanical, chemical, theremovacuum, or photoengraving means through these oxidation-inhibiting layers, for oxygen in-diffusion at selected areas.

V. Y. Doo in "Silicon Nitride, A New Diffusion Mask," IEEE Transactions on Electron Devices, Vol. 13, No. 7, 1966, pp. 561–563; and J. A. Apels et al in "Local Oxidation of Silicon and Its Applications in Semiconductor Device Technology," in Philips Research Reports 25, page 118, 1970 have described a successful silicon nitride masking technique for diffusion into silicon of oxygen, boron, gallium, phosphorous, and arsenic. Doo, for example, shows that $Si_3N_4$ layers 150 to 1200 A thick can be pyrolytically deposited on silicon from silane and ammonia with excess hydrogen at 750 to 1100° C. These layers, after photoengraving, mask the diffusion of B, P, As, Ca, and O. The photoengraving process involves a KMER (Eastman Kodak) photoresist masking layer formed on the $Si_3N_4$ layer. This layer is exposed to ultra-violet light through a mask, and selectively removed at "window" areas by hydrofluoric or phosphoric acids. Foreign atoms of O, B, Ga, P, and As may then thermally diffuse into the silicon through these windows exclusively.

Other related technique on thermal oxidation are discussed by Kennedy, D. P. and Murley, P. C. in "Calculations of impurity Atom Diffusion Through A Narrow Diffusion Mask Opening", IBM Jour. Vol. 10, 1966, pp 6–12 (especially FIGS. 1 and 4); and by Lee, T. P. and Sze, S. M. in "Depletion Layer Capacitance of Cylindrical and Spherical Junctions," Solid State Electronics, Vol. 10, 1967, pp 1105–1108.

In thermal oxidation, one mole of silicon (28.0 g or 12.0 cc) reacts with one mole of oxygen (32.0 g) to form one mole of $SiO_2$ (60.0 g or 25.9 cc). The densities of silicon and $SiO_2$ are 2.34 and 2.32, respectively. The volume ratio of $SiO_2$ to the original silicon is 25.9/12.0=2.16. If unrestricted, the linear expansion of the silicon upon complete, in-situ oxidation to $SiO_2$ is the cubic root of (2.16)–1.00=29.2%. Similarly, the in-situ formation of $Si_3N_4$ from Si also produces a linear expansion of 4.3%, if the density of the nitride is 3.44, as reported. The significant linear and volume expansion during the formation of the entire discrete, oxide (or nitride) region (not layer or coating) from silicon introduces compressive stresses parallel to the PN junction planes 15 and 16, i.e., across the lateral dimension of the junction and oxide regions. Properly directed, moderate amount of residual compressive stresses, e.g., from the mismatched expansion coefficients strengthen the brittle Si and $SiO_2$, are beneficial for the device to withstand thermomechanical stresses. Excessive stresses can also cause mechanical failures of the device in the form of microcracks or interfacial debonding.

Many types of stresses arise from processing and handling stresses, in-situ formation stresses due to volume expansion of silicon oxide from silicon, and thermal mismatch between the silicon and silicon oxide during thermal cycling in device operation. Because the oxide region in FIG. 2 comprises at the top a free (vacuum-exposed or gas-exposed) surface and a rounded bottom (with no sharp corners), and because of graded seal or gradual (oxygen) concentration effects, these high stresses are spreaded out evenly over wide areas (providing stress relief), thereby avoiding splitting cracks. The resultant device is thus resistant to relative tangential movement (i.e., rubbing contaminations) between the semiconductor silicon and $SiO_2$ at the junction peripheral surface 26, and also to crack formations by mismatch stresses during thermal cycling, such as from repeated, on-off operations of the device.

These harmful stresses arise from several reasons: 1) $SiO_2$ expands, i.e., has a temperature coefficient of thermal expansion of, about $5.0 \times 10^{-7}/°$ C. while silicon expand about ten times as much. A silicon wafer bonded with $SiO_2$ subjected to a single 0 to 8° C. thermal cycle will thus subject the brittle silicon to a mismatch stress of about 10,000 psi; and 2) the oxidation step is usually done at high temperature (up to 1350° C.) in an oxidizing ambient (e.g., steam), so as to allow great build-up of the mismatch stresses during the wide cooling temperature range; 3) the normal stresses at the free (i.e., gas or vacuum exposed) surface of oxide must be zero. There is, therefore, a very steep normal stress gradient across the very thin surface layer; and 4) the geometry of the thin surface layer (see layer 27 in FIG. 2) allows no stresses relief, particularly when the layer is flat. These conditions generally result in pinholes, microcracks, faults, imperfect oxide protection, and loss of device passivation. Further, any oxide defect will immediately expose the underneath silicon to the ambient, again because the surface oxide layer is thin. Modern miniaturized circuits have very shallow PN junctions, and are particularly prone to such failures.

In contrast, in the grown-in oxide region 21 of FIG. 2, the oxidation step is preferably done first when there is no junction region 25 to damage by mismatch stresses. The lower temperature (about 950° C. or lower) junction forming step actually acts as beneficial annealing and stress-relieving operation, thereby minimizing oxide failures. Even if the oxide is so damaged, the deep junction peripheral surface 26 may still not be affected. Also, there is no free or physically exposed surface in the oxide material region 21, except at the top surface 23 which is not as extensive as the oxide surface layer 27.

The top free surface 23' in a horizontal semicylindrical groove is only 2r/(2r+Pixr)=38.9% of the total surface of the oxide region 21, in contrast to about 50% for the thin oxide layer 27 in FIG. 2 which has negligible edge thicknesses. The free surface of the oxide region is also far away from the deeply buried junction region 25, thereby minimizing the effect of ambient on the deeply located junction 25 through any surface-related defects in the oxide. The oxide groove 21 also terminates at its bottom in the form of a line of zero horizontal width. The horizontal stresses from the mismatches between the oxide and silicon at this bottom must also zero or minimal. Because of its cylindrical bottom and planar symmetry, the same oxide groove is subjected to further reduced mismatch stresses. The microscopically nearby junction region is, therefore, also much less severely stressed than higher points on the oxide-silicon interface. In addition, the generally sloping and/or curved or multiply sloped sides contacting the peripheral surface 26, and/or the close proximity (within one or two microns) of the rounded bottom of the oxide region or groove 21 to the PN junction region 25, further allow more stress and strain reliefs.

When very severely stressed, a solid oxide region (or even thin layer) in a turn-around V or U-shaped groove minimizes oxide cracking and loss of device passivation, if the sensitive PN junction is microscopically close to the exact bottom of the groove. When such a groove has a rounded bottom, a new effect occurs, i.e., inverted arch effect. Solid oxide regions or even thin layers in the rounded bottom has an arch structure that can withstand much greater forces without failure than if the regions or layers are flat. These results further show the critical importance of proper geometry and location of the isolation oxide material.

A flat, thin (3,000 to 12,000 Angstroms) layer on any mismatched substrate is likely to crack when extended in dimension. Familiar remedies are intentional gaps in railroad tracks or concrete highways. But gaps in passivating layers on semiconductor devices are contaminating and intolerable. Also, once a thin oxide layer is cracked or even microcracked, no amount of etching, cutting, grinding, or filling will restore its integrity and imperviousness. Its passivating qualities are thus forever lost or greatly reduced.

The present invention overcomes this mismatch problem in several ways. The oxide is purposed broken up, during its formation period, into small patches. Being proportional to the linear dimension, the mismatch stresses are relatively small and tolerable. The isolated silicon pockets can be considered as gaps in an otherwise continuous oxide structure. Other solutions of the problems such as by proper oxide geometry, location, orientation, formative conditions, . . . , have already been described elsewhere in this application.

In the formation of the conventional thin oxide layers, the oxygen atoms diffuse uniformly over the layered portions of the exposed silicon surface, essentially in a single direction normally of the same layer, as shown by the arrows across the layer 27 in FIG. 2. Surface oxidation parallel to the PN junction region thus develops great harmful shear stresses in the direction of the PN junction to increase the chances of shearing and contaminating damage to the PN junction.

In the oxide region of this invention, the oxygen atoms generally diffuse through windows in the $Si_3N_4$ layer, transversely downward as well as sideways. The depression is multi-directional, as shown by arrows in the oxide region 21 of FIG. 2). The oxidation thus proceeds laterally outward in many direction from a transversely extending, moving solid core with no free surface to dissipate stresses, thereby allowing the build-up of beneficial compressive stresses in the lateral directions across the silicon pockets and PN junctions. These compressive stresses minimize shear and contamination, particularly to the nearly PN junction, and are an important feature of the new isolation oxide regions. Even a thin oxide layer (e.g., 0.8 micron) at the bottom of a symmetrical, 20° V-shaped groove (in which the oxide height measures 0.8/sin 10°=4.6 microns) can achieve these beneficial stresses. The thin oxide layers at the V-shaped or U-shaped groove bottoms also achieve the desirable wedging or arching action, minimizing oxide failures. Hence, the PN junction must be critically located, such as at no more than one or two microns above the groove bottom. Also, the oxide so formed must be unetched, uncut, or otherwise similarly undisturbed and unmodified.

Thus, while the thin surface oxide layer 27 of FIG. 2 has the improper geometry, position, orientation, and formative conditions to allow adequate stress and strain relief on the peripheral surface of the PN junction region, the properly formed, shaped, sized, positioned, and oriented oxide region 21 of the same figure achieves improved stressing and straining patterns and beneficial compressive stress on the same peripheral surface, thereby improving device surface passivation and stabilization. Hence, the transversely extending, oxide region 21 differs from the thin surface layer of even the same metallurgically continuous oxide or nitride coatings normally used for some surface protection.

This is one main reason why thin oxide films are not passivating. Partly due to its thinness, these films easily cracks or blisters, spalls, and debonds under stresses, thereby losing its passivating qualities. In the present invention, the new devices have oxide or nitride isolating groove or regions having typically 1 to 4 orders of magnitude thicker cross-sections (relative to a 5,000 Angstrom thick film) to withstand the stresses. At least the central portions of these isolating grooves have cylindrical bottoms having inverted arch shapes. It is well known that arcs withstand stresses much better than flat shapes, partly because of stress and strain distribution and relief. Hence, the new devices are mechanically more stable and reliable partly because of the invert arch effect.

An oxide region consisting entirely of in-situ formed silicon oxide is advantageous for other reasons. The oxide region is 100% dense, substantially chemically pure and uniform, and non-contaminating. It is also impervious to contaminating gases and mobile ions, being made more so by the residual compressive stresses. This is in sharp contrast to other procedures in which the cut or etched-out grooves in silicon are only superficially oxidized into thin (e.g., 8000 A) $SiO_2$ layers and later filled with such materials as polycrystalline silicon, glasses, oxides, or plastics. Flat oxide layers on silicon, as shown below, have no curvature-related strain-relief mechanisms and are unreliable because of crack formations in the layer through the same mismatch stresses acting harmfully here.

In addition, the common filling materials are almost always impure, particularly when compared to $SiO_2$ formed in-situ. Schwartzman, for example, pointed out in his U.S. Pat. No. 3,383,760, Col. 4, lines 4–6 that most glasses contain impurities that may adversely affect the PN junction. Further, the filled materials are not 100% dense, particularly with narrow grooves in microcircuits (See, e.g., Frouin U.S. Pat. No. 3,500,139, Col. 2, lines 44–46), and do not contribute to the beneficial compressive mismatch stresses. In addition, both the cracked oxide layer and porous filled materials "breathe" to easily contaminate the shallowly located, PN junctions.

In contrast to in-situ formed oxide layers, the discrete or spaced-apart, specially shaped and positioned, oxide regions of this invention lower, through curvature, proximity, and other unique effects, the mismatch stresses. There is also the beneficial compressive stress pattern, but no excessive built-ups of harmful stresses that case crack, split, or microcrack in the device. There are limits between the relative areas occupied by the silicon and silicon oxide regions, and as to the maximum lateral dimension of the oxide region and the minimum separating distance between neighboring oxide regions. From chip real-estate considerations, there is a . . . maximum lateral dimension of the oxide region. As a rule, the relative area ratios of silicon to $SiO_2$ should be between 3:1 to 8:1. The maximum lateral dimension of silicon is about 4–15 times the depth of the oxide region.

A cylindrical or, in general, rounded groove bottom lessens the splitting forces on the neighboring silicon layer because the oxide (or nitride) region favorably compressed during the oxide formation step. The groove bottom has a blunt, rather than a sharp tip or bottom (no notch effect). The mismatch stresses between silicon and its attached $SiO_2$ always continuously and nonabruptly vary at rounded bottom (curvature effect). These stresses are smaller on a curved adjoining surface than on a flat adjoining surface (curvature effect on stress pattern). In particular, the stresses are zero or minimal in the lateral direction at the bottom if it has a zero width, and minimal and symmetrically distributed when the rounded bottom is symmetrical with respect to a longitudinal bisecting plane thereof (oxide region geometry effect). Hence, It is highly desirable to locate the PN junction at (to achieve large surface expansion), or within a micron or a few microns of (for proximity effect) the bottom of the round-bottomed oxide region.

In the devices of FIGS. 1–2, an n-type, the first solid material layer (e.g., 24) is formed on a p-type, second solid state material substrate (e.g., 22), to thereby form a PN junction region 25. Both materials are semiconducting silicon. Actually, one of the first and second solid state materials may be a metal, while the other solid state material is a semiconductor, to thereby form a Schottky or metal-semiconductor barrier. Both PN junction and Schottky rectifying barrier are substantially conductive under forward bias but substantially non-conductive under reverse bias. Thus, both the PN junction and the Schottky barrier can be both substantially non-conductive or conductive under an applied bias of at least one selected polarity.

To make the device of FIG. 3, a single groove 32 made into the top surface 33 of a slab or wafer of intrinsic semiconductor material 31 (FIG. 3a). The same slab may be alignedly grooved on both the top and bottom surfaces (FIG. 3b). Next, n-type and p-type dopants are diffused in, from the top and bottom surfaces, 32 and 34, respectively. The result is a top n-type layer 35, a bottom p-type epitaxial layer 36, and an intermediate, striped or pan-cake type PN junction region 37. This junction region is well inside the slab and is completely surrounded by and buried in the electronically inert material 31. The same junction region can be planar or curved, depending on the surface concentrations of the n-type and p-type dopants and also on the slab thickness.

The device of FIG. 4 is made by forming, in a manner similar to the making of the device of FIG. 2. Here, an oxide, nitride, or other inert material region 41, together with the PN junction between two silicon layers 42 and 47, isolates the two left and right diodes. A narrow but deep hole or slot 43 is then formed to introduce three-dimensional p-type dopant and to form the p-type base region 44, according to the U.S. Pat. No. 3,585,714 patent. Finally, a shorter hole or slot 45 is made to similarly form the n-type emitter region 46. This completes a new NPN transistor structure in the top n-type layer 42.

The holes may be only 1 microns wide or in diameter. See U.S. Pat. No. 3,585,714 and later discussions on ion implantation. Their bottoms may be flat, rounded, cylindrical, hemispherical, conical or V-shaped (U.S. Pat. No. 3,585, 714:3/70–72 and 9/6). Both of these holes or slots 43 and 45 are parallel to each other, and oriented normally of the top or bottom major surfaces of the wafer 42/47. Since they are different in lengths, they extend vertically downward to different depths into the semiconductor wafer. In other preferred embodiments, these holes need not be parallel to each other, or normally oriented of upper or bottom major surface of the wafer. As shown elsewhere, dopants, oxygen, nitrogen, or other atoms foreign to the semiconductor material may be introduced into these depressions, through the newly exposed walls of these depressions, by diffusion, ion implantation, or chemical depositions and with or without the three-dimensional source control described in U.S. Pat. No. 3,585,714; Ser. No. 154,300, and their subsequent applications.

The hole may be no more than 1 or 2 microns in diameter or width, but may have length/width ratio of 3–5. Hence, on a cross-sectional plane passing through the longitudinal axis of the hole and oriented normally of the bottom major surface of the semiconductor substrate, the hole (or groove) may have a central bottom point G, and two side points A and B, 1 or 2 microns apart and respectively at a horizontal distance of ½ or 1 microns from G. Vertically or normally of the bottom major surface of the semiconductor wafer, the points A and B may be 3–5 (or 6–10) microns from the groove bottom G.

By controlling the shape, size, and location of the holes, slots, or other depressions, and the type, surface concentration or total amount of dopant or other foreign atoms introduced by diffusion or ion implantation through the newly-formed groove surfaces, other unique diodes, transistors, tetrodes . . . are possible. Oxygen, nitrogen, and other foreign atoms (Ga, B, and P for doping) are useful to form the required isolation inert material region or low-resistivity regions underneath an isolation PN junction to connect pockets of the otherwise electrically isolated silicon material. These pockets are separated by the oxide grooves or regions 41.

Oxygen or nitrogen may also be introduced through the newly formed surfaces of the narrow but deep holes or slots, or other grooves, with or without the three-dimensional diffusion (with internal point, line, surface, or mass diffusion sources) respectively by thermal diffusion or ion/proton implantation methods. Empty grooves may also be filled by chemical vapor deposition.

The npn transistor in FIG. 4 is completely or totally isolated electrically from neighboring npn transistors (not shown), laterally by the oxide region 41 and underneath by the PN isolation junction 48. The silicon pockets and npn transistors are completely isolated from each other. In FIG. 2, the emitter-base and base-collector junctions 25e and 25b of the npn transistor is also electrically isolated from similar npn transistors on the other (e.g., left) side of the oxide region 21.

Similarly, the integrated circuit device of FIG. 2 can be used as a silicon structure of passive resistors 24L, 24R, . . . , only. These resistors are then also completely electrically isolated from each other by the oxide region 21 and the PN isolation junction 25.

The device of FIG. 4 may be made to contain a npn transistor formed by the materials 42-44-43, a pnpn or npnp tetrode formed by materials 49-42-44-43 or 42-44-46-45, respectively. To make these components, a narrow but deep hole 43 or shallow hole 45 must first be formed, followed by three-dimensional diffusion or ion-implantation of the proper dopants through the newly formed grooved surfaces. Both the deep and shallow holes are cylindrical shaped, and have cylindrical bottoms.

FIGS. 5–6 of the U.S. Pat. Nos. 3,430,109 and 3,585,714 patents, FIGS. 6–7 of the U.S. Pat. Nos. 5,082,793 and 4,946,800 patents, and FIGS. 6–7 of the Ser. Nos. 07/809, 460, and 08/313/350 applications all show a piece of a monolithic microcircuitry broken off from a 2 cm×2 cm semiconductor wafer containing, say, 30×30 or 900 individual, isolated circuit elements. The groove radius, r, in these examples must therefore, necessarily be very small, such as 1 micron, to make the miniaturization possible. Small radius r also provides maximum protection against Type II contaminants during processing. There are two groups of linear and mutually perpendicular, gas or solid-filled isolating grooves 72. FIG. 7 shows a vertical cross-section of the same microcircuitry piece taken along line 7—7 of FIG. 6. Here, the grooves originate from the top surface 73 and have cylindrical bottoms. The bottoms lie directly in the lower boundary plane 76 of the junction region 71 between the top and bottom layers 75 and 76. Each of the isolated circuit elements located in the individual silicon pockets 74 can operate independently of the others in signal translation. The performance of the signal translation is improved by the unique shape, size, and position of the grooves.

The high-power laser device of FIG. 5 is made in a manner similar to the making of the device of FIG. 3b. Here, two grooves 52 and 53 are formed into an intrinsic material slab 51. Dopant diffusions are then carried out to form the n-type top region 54 and p-type bottom region 55. These two regions are separated by the buried PN junction region 56. Rapidly moving cooling fluid jets or streams 57 and 58 (such as of air, water, or brine) are introduced tangentially to the grooves, as shown. The high velocity and centrifugal force of the jets or streams insure good thermal contact of the cooling fluid to insure efficient surface cooling. In this device, the light beams travel in directions normal to the figure, being bounded by two optically flat surfaces (not shown) parallel to the drawing paper. One of these two surfaces allows the laser beam to come, e.g., out of the paper. Alternately, the intrinsic material region 51 may be replaced by thermally grown-in silicon dioxide on a silicon substrate. The active regions of the devices of FIGS. 3 and 5 are isolated from the ambient-exposed surfaces of the device, where rapid degradation is likely. The solid regions 31 or 51 on either side of the stripe active region are able to carry heat away from the current-carrying active region.

FIG. 8 shows a portion of an integrated circuit which is "universal". The circuit contains a large number of combinations of electrically isolated, active and passive circuit components, such as diodes, triodes, tetrodes, . . . , resistors, and capacitors. Yet the circuit has only five carefully chosen and physically integral, semiconducting layers. These layers, respectively n, $p^+$, n, p, n in conductivity types from the top down, produce all these components. A substrate may contain the bottom one to four layers with the remaining top four to layers epitaxially deposited thereon. These five layers and the gas or oxide filled groove YWY'W' can provide: four pairs of diodes, three pairs of triodes or transistors, two pairs of tetrodes, or a single pair of pentodes.

From suitably connected regions in these same coacting semiconductor layers, many precision resistors, capacitors, electrically conductive paths, and other passive components can be also made. The dimension and operating characteristics of these components are accurately defined laterally by the enclosing, microscopically precise air or oxide grooves, and transversely by the electrically rectifying PN junction. Low resistivity layers may form cross-overs, cross-unders, buried collector layer, . . . , to be suitably connected by diffusion or metal films. The main groove YWY'W' comprises several subgrooves, such as at Y, W, Y', and W'. The bottom of the main groove YWY'W' is within a few microns of most of these layers or PN junction, while the bottoms of most of these subgrooves are within a few microns above some PN junctions but below others.

As usual, the manufacture of these microcircuits containing both active components and passive components involve such repeated processing steps as forming nitride insulating layer; masking and selective nitride (or oxide) removal; etching, grinding or energetic beam bombarding to form microscopically precise grooves into these exposed areas; thermal oxidation or implantation and dopant diffusion into these grooves; masking and selective oxide removal; removal of residual nitride or oxide layer after oxygen or dopant diffusion; forming low-resistivity cross-over or cross-under regions similar to Doo's $P^+$-type region 4 in the p substrate (see, e.g., U.S. Pat. No. 3,386,865); dopant diffusion or ion implantation through oxide window for PN junction formation or electrical contacting to the low-resistivity, buried cross-overs or cross-unders; and electrical contacting through windows in oxide layers covering the device surfaces.

The second and third (from top down) semiconductor layers have superscripts to indicate very heavily doped, p-type and n-type materials, respectively. These superscripts may be "-" to indicate very lightly doped materials. Two more useful combinations of the semiconducting layers thus obtain: $np^-n^-pn$ and $npn^-p^-n$. Low-resistivity $N^+$ and $P^+$-type layers 82 and 83 in the substrate may form buried cross-unders to connect isolated silicon pockets electrically.

According to this invention, oxide or nitride-isolated, monolithic solid-state circuitries having densely-packed, electronically discrete solid-state components are possible by intersecting and triangular, square, or, in general, polygonal or close-ended (or annular), isolation oxide grooves. These grooves, in any possible top widths or configurations and cross-sectional shapes, completely and accurately define the lateral limits of the active region or isolated silicon pockets or islands. These cross-ended grooves are to be referred to as "annular-shaped isolation regions."

To minimize physical damage during mechanical grooving, to facilitate microscopically precise chemical etching or cutting, to maximize device yield, or to obtain other special optoelectrical effects, the directions of the grooves may coincide with crystallographic directions of extreme or maximum atomic density of either the semiconductor substrate 22, or the epitaxial layer 24, or both. The <111> directions on (111) wafers and the <100> directions on (100) wafers of silicon or germanium are, therefore, preferable. Together with the isolating PN junction, such a system of grooves formed on a device wafer may produce many discrete and electrically independently operable, active or passive circuit components.

By preparing a groove, slot, hole, or other depression into the semiconductor layer, and introducing the right amount of dopants or foreign atoms (such as O, N, Ga, B, P, As) at selected locations in the resultant grooves, internal point, line, surface, or massive types of three-dimensional sources of foreign atoms are then obtained, Thermal oxidation or ion/proton implantation may then be applied to achieve exact three-dimensional configuration and/or concentration profile of the diffusing or implanted atoms. Skilled persons can use any of these techniques not only to prepare the emitter, base, and collector regions of transistors (see FIG. 4); but also to form regions of differing conductivity type in the oxide-isolated silicon pockets 24L and 24R; to prepare the conventional, low-resistivity cross-unders or cross-overs located in the substrate 22 directly beneath the epitaxial layer 24 so for interconnecting regions 24L and 24R separated by the oxide isolation regions 21 (FIG. 8); to convert entire oxide-isolated silicon pockets into other low resistivity regions by dopant diffusion for use as cross-under or cross-overs; and the like.

Three-dimensional, configuration or diffusional front control (U.S. Pat. No. 3,585,714:9/16–28; Ser. No. 154,300:6/30–7/2; and also subsequent applications) can be combined with the nitride shielding method disclosed above. Take, for example, the integrated circuit device of FIG. 2. Here, a uniform, oxidation inhibiting (or insulating) silicon nitride layer is first laid on the top surface 23 of an n-type silicon layer 24 epitaxially grown on top of a p-type substrate 22. Windows are opened up in this nitride layer, e.g., by selective HF etching. Grooves are then made in the window areas by special mechanical polishing, chemical etching or energetic particles bombardment methods. The silicon wafer is then oxygen implanted or thermally oxidized, through the newly exposed surface of the depression to form the oxidized silicon isolation regions 21 extending through the epitaxial layer 24 into the isolation PN junction 25. This procedure subdivides the epitaxial silicon layer 24 into many oxide-enclosed and electrically isolated, pockets of semiconductor silicon material. Any residual nitride layers can easily be removed after their uses by HF or $H_3PO_4$. This procedure provides microscopically accurate oxide regions with planar top surface 23', which is coplanar relative to the silicon layer surface 23.

The device of FIG. 2 contains only a simple, PN junction to exemplify the optoelectromagnetic, signal-translating active region. Other devices may have much more complicated structures. Specifically, the top and/or bottom layers 24 and 22 of FIG. 2 may be replaced by, for example, up to five layers of the device in FIG. 8, and contain not only P and N layers but also P+, N+, $i_p$ (very weakly P-type intrinsic), and in (very weakly N-type intrinsic) materials. The P or N materials are widely (by at least several orders of magnitude) different in electrical conductivity and dopant concentrations relative to $P^+$ and $i_p$ or $N^+$ and $i_n$, respectively. These layers may be prepared either before, during, or after the gas or solid-filled isolating grooves are formed, as per conventional semiconductor technology.

The thermally grown-in oxide, ion-implanted oxide or nitride, or the intrinsic material regions of the devices of FIGS. 1–5 are not only electronically inert but also unetched, uncut, and otherwise similarly unmodified. This condition preserves the as-formed, metallurgical continuity. Metallurgical continuity or, even better, metallurgically perfectly and continuously bonded silicon to $SiO_2$, obtained by thermal oxidation or implantations to form grooves of special shapes, reduces or minimizes mismatch stresses partly through the arch and graded-seal effects. "Microscopically perfect bonding" means that the components (i.e., silicon and $SiO_2$) are bonded with a nearly 100% dense, bonding region which is microscopically defect-free, i.e., with no visible microcracks even at 1,000 magnifications. These material regions are completely different in structure, mode of operation, and result from the usual, painted-on organics, fired-on glasses, filled organics, physical or even chemical depositions. All of these processes give non-perfect bonding regions with many voids and microcracks.

Even the common oxide or nitride surface layers are too thin and too imperfect, and also improperly oriented and positioned relative to the PN junction region, to achieve the results of this invention. Specifically, the conventional, relatively thin and planar oxide surface layer for device junction passivation is, for example, very thin, typically 4000 A. As mentioned above, too thin a layer tends to crack and gives inadequate protection, while too thick a layer often peels or flakes off and causes extensive mismatch shear stresses at the oxide-silicon interfaces.

As an alternative to thermal oxidation or nitridation, oxygen and nitrogen may be introduced into the surface 23' by ion or proton implantation or thermal diffusion. Under an implanting voltage of one megavolt, oxygen and nitrogen ions can be introduced into silicon host to a depth of 1.7+/−0.13 um and 1.87+/−0.12 um, respectively. Ion implantation is taught, for example, in U.S. Pat. Nos. 2,787,564; 3,434,894; 3,341,754; 3,326,176; and 3,563,809, respectively of Shockley, Gale, Kellett et al, Sibley, and Wilson.

Shockley in October 1954 taught:

(1) that use of mass spectroscopy separates ions of different masses to generate mono-energetic ion beams for uniform penetration (col. 4, line 72 to Col 5, line 27, or 4/72–5/27);

(2) that by varying the accelerating potential variations in the depth of penetration may be achieved, that by using a suitable apertured mask, moving the wafer, or sweeping the ion beam with a deflection system intermediate between the cathode and the work predetermined geometry of the implanted region is possible (2/19–23); and (3) that ion implanted semiconductor can be annealed at relatively low temperatures (compared to thermal diffusion) to stabilize and repair radiation damage in the newly formed interior zone without appreciable thermal migration of the implanted atoms (5/18–24 and 2/9–15).

Gale taught the use of magnetic ion optical system to deflect and focus the ion beam, and to achieve a reduction of 100:1 so that a mask aperture of 100 micron square aperture gives 1 micron square at the substrate and 1 micron wide tracks can be achieved (3/71–72,6/59–61, and 5/16–18), and that no mask is needed (6/19–21). Kellett et al taught that ion penetrates straight into the material into the desired depth and does not diffuse in the body of the silicon after implantation, the boundaries of the implanted region are relatively sharp. In particular, the edge of the implanted region may be controlled with great accuracy down to some few hundred atomic layers (3/20–25). The sharp boundaries results from the annealing of irradiated regions at typically 400–800° C. for 10 minutes, which gives a oxygen (or nitrogen) diffusion length at least two or three orders of magnitude smaller than that due to the common thermal oxidation above 1,000° C. for two hours.

Sibley used computer programmed control on the deflecting means to "write" with a collimated ion beam of selected mass to produce a predetermined integrated circuit pattern on the workpiece (2/20–62). Wilson taught the implantation of oxygen or nitrogen to form electrically insulating and protective films of silicon dioxide or silicon nitride thereon (4/37–41), without masking, wet chemistry, and photolithography (4/49–52). The shape, size, and location of the resultant oxide grooves can be microscopically accurately controlled with the ion implantation method. The width of the groove when ion implantation is used can be less than a micron using a relative movement between the implanting beam and the silicon material, with corresponding adjustment of beam characteristics such as beam energy, current, profile, and focusing, so as to achieve the precise groove shape and chemical composition (14/26–15/4).

Additionally, Gibbons, J. F. in "Ion Implantation" in Semiconductor Part I Range Distribution Theory and Experiments, Proc. of IEEE March 1968, pp. 295–319 teach in detail the method of introducing precise amount of impurities, such as oxygen, to achieve exact three-dimensional control in shape, size, location, and chemical composition to fractional micron accuracies by modulating the energy, current, duration, and position of the ion beam, and the use of apertured masks, moving wafers, and ion deflection or separation systems (17/8–15). Also, argon ion bemas can serve as a precision material removal tool (17/24–28). Other disclosures of ion implantation techniques known prior to 1971 include: Burrill, J. T. et al in "Ion Implantation as a Production Technique,". IEEE Trans. on Electron Devices, Vol. ED. 14, No. 1, January 1967, pp 10–17; Buchanan, B. et al in "High-Energy (1 to 2.5 Mev) Ion Implantation for Obtaining Novel Semiconductor Junction Structure," International Conference on Applications of Ion Beams to Semiconductor Technology, Grenoble, 1967, pp 649–668; and Blamiers, N. G. in "A Preliminary Study of Semiconductor Structures Produced by Ion Implantation," given at the same International Conference on pp 669–684.

These scientists and engineers taught that through control of beam size and aiming point by, e.g., aligning, focusing, and aligning and focusing, ion implantation can control the dimension, shape, and three-dimensional chemical compositions to fractional micron accuracies. Also argon ion bemas can serve as a precision material removal tool. These techniques can be combined in different ways obvious to the skilled person. I hereby incorporate the above-referenced patents and papers of Shockley, Gale, Kellett et al, Sibley, Wilson, Gibbon, Burrill et al, Buchanan et al, and Blamiers into this application.

Ion implantation and proton implantation, accurate even to several Angstroms in depth, lateral dimensions, accuracies, and chemical composition profiles were well developed prior to 1971. The Ser. No. 154,300 application, filed Jun. 18, 1971 shows at 6/13–15 that under an implanting voltage of one megavolt, oxygen and nitrogen ions can be implanted into silicon host to a depth of 1.7+/−0.13 microns and 1.87+/−0.12 microns, respectively. That is, the vertical or depth resolution is of about 0.13 microns, or 1,300 Angstroms. The Ser. No. 07/809,460 application at 14/26–15/4 shows that The width of the groove when ion implantation is used can be from about a micron up, using a relative movement between the implanting beam and the silicon material, with corresponding adjustment of beam characteristics such as beam energy, current, profile, and focusing, as taught in the prior art cited above.

In summary, the distinguishing features of ion or proton implantation relative to the other methods of introducing foreign atom into semiconductors including thermal diffusion or melt alloying are as follows. Ion implantation:

(1) penetrates straight without appreciable lateral diffusion to give orders of magnitude sharper boundaries;

(2) achieves controlled size of the implantation region down to less than 1 micron, with an accuracy of 1,000 Angstroms (0.10 micron) or even several Angstroms;

(3) can be done without masking, wet chemistry, and photolithography;

(4) if mask is used, the implanted size can be reduced by one order of magnitude (10 times) from the mask aperture size, down to, e.g., 1 micron;

(5) the implanted region need not start at the surface of contact with the foreign matter;

(6) argon ion beams may be used to microscopically precisely remove materials from semiconductor surfaces;

(7) can control the shape and three-dimensional chemical compositions to fractional micron accuracies; and (8) when used for PN junction or oxide/nitride grove formation, the chemical composition profiles and, in particular, critical PN junction grading, can be of any selected shape, rather than only the exponential or erfc grading with thermal diffusion, respectively for limited or infinite surface diffusion source by thermal diffusion.

In the devices of FIGS. 1–2, an n-type, first solid state material 24 is formed on a p-type, second solid state material substrate 22, to thereby form a PN junction region 25. Both materials are semiconducting silicon. Actually, one of the first and second solid state materials may be or comprise a metal, while the other solid state material is a semiconductor, to thereby form a Schottky or metal-semiconductor barrier. Both PN junction and Schottky rectifying barrier are substantially conductive under forward bias but substantially non-conductive under reverse bias. The following United States patents or applications relating to solid state devices of the present invention are made of record:

U.S. Pat. No. 3,430,109—Solid-State Device with Differentially Expanded Junction Surfaces;

U.S. Pat. No. 3,585,714—Method for Making Solid-State Devices;

Application Ser. No. 154,300—Method for Making Solid-State Devices, filed Jun. 18, 1971;

U.S. Pat. No. 4,946,800—Method for Making Solid-State Devices Utilizing Isolation Grooves;

Application Ser. No. 438,692, filed Nov. 17, 1989;

Application Ser. Nos. 07/816,626 and 07/809,460, both filed Dec. 9, 1991;

U.S. Pat. No. 5,082,793—Method for Making Solid-State Device Utilizing Ion Implantation Techniques; and Application Ser. No. 08/313,350, filed Sep. 27, 1994.

The invention, as described above, is not to be construed as limited to the particular forms disclosed herein, since these are to be regarded as illustrative rather than restrictive. For example, certain modifications to the structures and methods for making the devices of this invention may be found in my U.S. Pat. Nos. 3,430,109; 3,585,714; Ser. No. 154,300; U.S. Pat. Nos. 4,946,800; 4,916,513; 5,082,793; Ser. Nos. 07/816,626; 07/809,460; and in pending patent application Ser. No. 313,350; Dec. 9, 1991, reference being made directly thereto as part of the instant disclosure. Further modifications are noted as follows:

Modifications to the apparatus described which fall within the scope of the instant invention are noted as follows:

1. Ge, GaAs, Gap, InP, InSb, and other III–V or II–VI compounds, may, e.g., replace Si. Other useful materials include various semiconducting compounds consisting essentially of at least two elements respectively selected from at least two different groups of the periodic table;

2. Grooves may be formed by precision mechanical, chemical, and bombarding of energetic particles including ions, protons, electrons, and laser photons. The various grooving methods may be combined in any combinations simultaneously, sequentially, or repeatedly;

3. The shape of depressions produced by various methods may be any of many prescribed shapes including those having cylindrical, parabolic, conical (U.S. Pat. No. 3,585,714:) shapes;

4. Micron-size narrow but deep drilled cylindrical grooves holes made by various methods to, e.g., remove submicron dislocation or microprecipitate U.S. Pat. No. 3,595,714:9/16–17 and 9/70–10/5), to provide three-dimensional point, line, or surface diffusion sources of dopants, nondopants, or insulating compound forming agents, or to make the ion implantation process more versatile;

5. Any of the groove may have any shape, size, length, width, and positions 5.0, 1.0, 0.1, and 0 microns below or above the PN junction;

6. The groove may locally expand the peripheral junction surface infinitely (at h=0), 71 times (at h=1.0 micron), or other different values, or even none at all (e.g., for h=0) for solar cells, surface cooling, or controlled ambient-semiconductor interaction; and 7. A groove with rounded bottom G has zero width and, hence, zero mismatch stress. Zero or minimal mismatch stress therefore occur along a line represented by the point G on a cross-sectional plane. The point G may be 5, 1, 0.1, or 0 microns below the PN junction, or 1 micron below

I claim:

1. A solid state semiconductor device comprising:
a first solid semiconductor material of one conductivity type, a second solid semiconductor material of an opposite conductivity type, said first and second solid semiconductor materials having respective adjoining regions, and a PN junction between said respective adjoining regions; and an electrically insulating solid material which adjoins said first solid semiconductor material, said second solid semiconductor material, and a lateral edge of said PN junction;

said electrically insulating solid material having a top curved interface with a radius of curvature selected from the group consisting of 0.001 cm, 0.01 cm, 0.1 cm, and 1.0 cm;

said first solid semiconductor material having a first portion which is above said PN junction and has a thickness which gradually changes with closeness in a lateral direction to said lateral edge of said PN junction;

said second solid semiconductor material having a first portion which is underneath said PN junction and has a thickness which gradually changes with closeness in a lateral direction to said lateral edge of said PN junction direction; and said electrically insulating material having a first portion which is laterally spaced from said PN junction and has a thickness which gradually decreases with closeness in a lateral direction to said lateral edge of said PN junction.

2. A solid state semiconductor device as in claim 1 in which:
said first solid semiconductor material has a first portion which is above said PN junction and has a thickness which gradually changes with closeness in a lateral direction to said lateral edge of sand PN junction; and wherein said first solid semiconductor material also has a second portion which is above said PN junction, is laterally spaced from said lateral edge of said PN junction, and is uniform in thickness.

3. A solid state semiconductor device as in claim 2, in which said electrically insulating material is an intrinsic semiconductor over 99.999% of which is a selected semiconductor and having few doping impurities and free electrons and holes to conduct electricity thereby having the resistivity or conductivity of that of a conventional insulating material.

4. A solid state semiconductor device comprising:
a first solid semiconductor material of one conductivity type, a second solid semiconductor material of an opposite conductivity type, said first and second solid semiconductor materials being at respective adjacent regions thereof, and an electronic signal-translating, rectifying barrier between said respective adjacent regions, said rectifying barrier having a lateral edge;

an electrically insulating solid material which adjoins said first solid semiconductor material, said second solid semiconductor material, and said lateral edge of said PN junction; and at least one of said first solid semiconductor material, said second solid semiconductor material, and said electrically insulating solid material having a designated first portion which has a thickness changing gradually along a selected lateral direction;

said second solid semiconductor material having a first portion which has a thickness changing gradually along a second lateral direction;

said electrically insulating solid material having a first portion which has a thickness changing gradually along a third lateral direction.

5. A solid state semiconductor device as in claim 4 in which:
said rectifying barrier has a thickness gradually increasing in a lateral direction from a selected lateral edge thereof toward its center.

6. A solid state semiconductor device as in claim 5 in which:
a radius of curvature of said rectifying barrier gradually decreases along a lateral direction from a center thereof towards either one of its left or right edge.

7. A solid state semiconductor device as in claim 4 in which:
the thickness of said first portion of said first solid semiconductor material and the thickness of said first portion of said second solid semiconductor material change in a complementary manner such that where one increases the other decreases.

8. A solid state semiconductor device as in claim 7 in which:
said first portion of said first solid semiconductor material adjoins and is above said PN junction, including above said cured portion of said PN junction.

9. A solid state semiconductor device as in claim 4 in which:
at least one of said first solid semiconductor material, said second solid semiconductor material, and said electrically insulating solid material has a respective selected portion thereof which is laterally spaced from said lateral edge of said PN junction and has a uniform thickness.

10. A solid state semiconductor device as in claim 4 in which:
at least one said first solid semiconductor material and said electrically insulating material consists essentially of a solid intrinsic semiconductor.

11. An active semiconductor device of less than one micron in size and having a vertical depth accuracy of better than 1,300 Angstroms, comprising:
a semiconductor substrate having one conductivity type;
a semiconductor pocket positioned adjacently on said substrate and having an opposite conductivity type;
an electronic signal-translating, rectifying barrier adjoining and forming as its top with, said pocket and adjoining and forming at its bottom with, said substrate; said rectifying barrier having a lateral edge; and
an electrically isolating solid material which adjoins and metallurgically perfectly bonds with all said substrate, said pocket, and said lateral edge of said rectifying barrier; with respective, nearly 100% dense bonding regions which are microscopically free of visible microcracks at 1,000 times magnification;
said barrier region having a selected surface which is microscopically precise, with a better than one micron in accuracy in shape, size, and position of the rectifying barrier;
on a vertical cross-section, said barrier region having a curved portion in a major central portion thereof.

12. An active semiconductor device as in claim 11 wherein at least one of said substrate, said pocket, and said rectifying barrier contains moderate, residual beneficial stresses to improve device performance.

13. An active semiconductor device as in claim 11 including means for beneficially stressing at least one of said substrate, said pocket, and said rectifying barrier to improve device performance.

14. An active semiconductor device as in claim 11 wherein at least one of said substrate, said pocket, and said rectifying barrier is an intrinsic semiconductor consisting essentially of a semiconductor material but having others of magnitude less doping impurities and free electrons and holes to conduct electricity so that the intrinsic semiconductor is orders of magnitude less electrically conductive than the doped semiconductor pocket and substrate of the device.

15. An active semiconductor devices as in claim 11 wherein at least one of said substrate, said pocket, and said rectifying barrier is of a semiconductor material selected from the group consisting of Si, Ge, GaAs, GaP, InP, In, Sb, and other III–V compounds, IV–VI compounds and
said electronically signal-translating, rectifying barrier is selected from the group consisting of PN junction, metal-oxide barrier, metal-semiconductor barrier, oxide-semiconductor barrier, heterojunction between different semiconductors, and other optoelectromagnetically active signal translating region.

16. An active semiconductor device as in claim 11 including a rapid, fluid cooling jet to cool at least one of said substrate, said pocket, and said rectifying barrier; and
including means for regulated optoelectromagnetic interaction of the signal-rectifying barrier with an object selected from the group consisting of ambient and contact material.

17. An active semiconductor device as in claim 11 including means for introducing a rapidly moving cooling fluid jet tangentially against a surface of interface of at least one of said semiconductor pocket and said rectifying barrier to insure efficient surface cooling of the device.

18. An active semiconductor device as in claim 11 wherein for said electrically insulating solid material, silicon nitride is used predominantly over silicon dioxide, because the linear expansion of silicon is 29.2% for in-situ oxidation from silicon dioxide but only 4.3% from silicon to silicon to $Si_3N_4$, resulting in much less thermal mismatch stresses for silicon nitride than silicon dioxide.

19. An active semiconductor device as in claim 11 having a non-planar top surface.

20. An active semiconductor device as in claim 11 wherein a doped semiconductor pocket of a semiconductor material sits on top of a undoped, intrinsic semiconductor of the same silicon semiconductor material.

* * * * *